(12) United States Patent
Cho

(10) Patent No.: US 7,056,823 B2
(45) Date of Patent: Jun. 6, 2006

(54) BACKEND METALLIZATION METHOD AND DEVICE OBTAINED THEREFROM

(75) Inventor: Chih-Chen Cho, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/032,093

(22) Filed: Jan. 11, 2005

(65) Prior Publication Data

US 2005/0116349 A1    Jun. 2, 2005

Related U.S. Application Data

(62) Division of application No. 09/517,314, filed on Mar. 2, 2000, now Pat. No. 6,858,937.

(51) Int. Cl.
*H01L 21/4763* (2006.01)

(52) U.S. Cl. .................. 438/622; 438/624; 438/626; 438/118; 257/773; 257/774

(58) Field of Classification Search .............. 438/118, 438/622, 624, 626
See application file for complete search history.

(56) References Cited

U.S. PATENT DOCUMENTS

| | | | |
|---|---|---|---|
| 5,097,381 A | 3/1992 | Vo | |
| 5,122,476 A | 6/1992 | Fazan et al. | |
| 5,598,027 A * | 1/1997 | Matsuura | 257/635 |
| 5,739,579 A * | 4/1998 | Chiang et al. | 257/635 |
| 5,880,030 A | 3/1999 | Fang et al. | |
| 6,008,117 A | 12/1999 | Hong et al. | |
| 6,097,095 A | 8/2000 | Chung | |
| 6,150,723 A | 11/2000 | Harper et al. | |
| 6,184,128 B1 | 2/2001 | Wang et al. | |
| 6,294,835 B1 | 9/2001 | Dalal et al. | |
| 6,303,486 B1 | 10/2001 | Park | |

OTHER PUBLICATIONS

Peter Singer, "Dual-Damascene Challenges Dielectric Etch", Semiconductor International, Aug. 1999, pp. 68-72.

* cited by examiner

*Primary Examiner*—Donghee Kang
(74) *Attorney, Agent, or Firm*—Dickstein Shapiro Morin & Oshinsky LLP

(57) ABSTRACT

A semiconductor device and a method of making it are described. During the formation of the semiconductor device, a hard mask is formed of an etch-resistant material. The mask prevents etchant from etching an area within a dielectric material near a conductive plug. The mask may be formed of a nitride. Conductive material is then deposited within an etched via and is contacted with the conductive plug.

8 Claims, 5 Drawing Sheets

BACKEND METALLIZATION METHOD AND DEVICE OBTAINED THEREFROM

CROSS-REFERENCE TO RELATED APPLICATION

This application is a divisional of U.S. patent application Ser. No. 09/517,314, filed on Mar. 2, 2000, the subject matter of which is incorporated in its entirety by reference herein.

FIELD OF THE INVENTION

The present invention relates to the fabrication of semiconductor devices. More particularly, the present invention relates to the backend metallization process used in the formation of semiconductor devices.

BACKGROUND OF THE INVENTION

There are a variety of semiconductor device types, one particular semiconductor device being a semiconductor memory device, such as random access memory (RAM) device. Known types of RAM devices include static random access memory (SRAM) devices and dynamic random access memory (DRAM) devices. A DRAM device contains an array of individual memory cells. Each cell includes an integrated circuit on a substrate and conductive material for electrically connecting the cell to other structures of a memory circuit.

With reference to FIG. 1, one conventional method for depositing conductive material for backend metallization, is a single Damascene method. FIG. 1 shows a simplified single Damascene method for forming a metallization connection to a substrate. It includes depositing a non-conductive layer of material 20, e.g. borophosphosilicate glass (BPSG), on a substrate 24 and pattern etching an opening within the material 20. A conductor, e.g. a metal or a doped polysilicon, is deposited over the material 20, thereby filling in the opening and providing a covering layer on the material 20. Chemical-mechanical polishing of the conductor removes the layer of conductor on the material 20, leaving a conductive plug $M_1$. The conductive plug $M_1$ is positioned on a doped region 22 provided in the substrate 24. An additional layer of non-conducting material 20, e.g. BPSG, is then deposited over the conductive plug $M_1$ and the previously deposited material 20. A via 21 is then etched in the material 20 above the conductive plug $M_1$. A conductive barrier material 12 is then deposited within the via 21 and over the additional material 20. Then another conductive layer 16 is deposited over the barrier layer 12, thereby completing an electrical connection between conductive layer 16 and doped region 20.

Vias 21 may be formed with a positive overlap (the conductive plug $M_1$ is of a greater diameter than the via 21), a zero overlap (the conductive plug $M_1$ and the via 21 are the same diameter), or a negative overlap (the conductive plug $M_1$ has a smaller diameter than the via 21). In FIG. 1, a negative overlap is shown. Because of the decreasing sizes of semiconductor devices, zero overlaps and negative overlaps are becoming more prevalent.

The conductive layers 12, 16 may be formed of any suitable conductive material, such as aluminum, copper or a highly doped polysilicon. The material 20 is preferably formed of a non-conductive material which is relatively easily removed in a chemical-mechanical polishing or etching process. Most preferably, and as noted, the material 20 is a doped silicate glass, such as, for example, BPSG.

In addition to the single Damascene method described above, a double Damascene method may be used to form a conductive connection. A double Damascene method for forming trench capacitors is described in "Dual-Damascene Challenges Dielectric Etch," Semiconductor International, p. 68–72, August 1999.

One disadvantage associated with the above-described fabrication method is that sometimes the etched via 21 in the material 20 is offset slightly relative to the plug $M_1$, as shown in FIG. 2. This most usually occurs in zero overlap and/or negative overlap fabrication processes. The etching of such an offset via 21 creates an offset opening portion 25 along the side of the conductive plug $M_1$, which during the subsequent layering of the conductive layers 12, 16 may form an air gap 26 (FIG. 2). Initially, the air gap 26 is relatively small, but as the conductive layers are deposited at elevated temperatures, the gas trapped in the gap 26 expands. The presence of a sizable and expanding air gap 26 sometimes prevents deposition of, or causes a rupture in, a continuous conductive layer 12 within the opening 25, which in turn may cause a defect in the conductive connection 14. This is because the conductive layer 12 is typically formed by first depositing a seeding layer for subsequent conductor formation. When part of the seeding layer is missing, a void is formed in both the seeding layer and the conductor which is formed above it. Further, the lack of a continuous conductive layer 12 may create a higher resistance in the ultimately formed conductive connection 14.

One approach at alleviating this disadvantage is to utilize a different conductive material for the conductive layer 12. Whereas aluminum or copper generally have been used for the conductive layer 12 (FIG. 2), titanium, titanium nitride or tungsten may be used in a conductive layer 112 of a conductive connection 114 (FIG. 3) of a semiconductor device 100. While the use of such materials tends to pinch off the size of an air gap 126 formed in an offset opening 125, in instances where the offset is relatively large, the conductive layer 112 still may not be formed as desired, thus creating the problems noted above. Further, titanium, titanium nitride and tungsten all have a higher electrical resistance than aluminum and copper within the ultimately formed conductive connection, which may create other problems.

There thus exists a need for a fabricated semiconductor device which does not tend to form the offset gap shown in FIG. 2.

SUMMARY OF THE INVENTION

The present invention avoids the offset gap shown in FIG. 2 by preventing any part of the via 21 from being etched along side of the plug $M_1$. This is accomplished by fabricating a structure in which a conductive connector comprises a conductive plug positioned within an insulator and provided on a substrate connection region, an etch-stop layer deposited on the insulator and around the conductive plug, an intermediate non-conductive layer having an etched via over the plug, a first conductive layer deposited in and in contact with the etched via and having a portion in contact with the conductive plug, and a second conductive layer deposited over the first conductive layer. The etch step layer prevents the via from being etched along the side of the plug during via formation.

According to another aspect of the present invention, a memory device including at least one memory cell may be provided with the just described conductive connector.

The present invention also relates to a method of making a semiconductor conductive connector. The method includes providing a first layer of dielectric material on an integrated circuit substrate, forming a conductive plug within the first dielectric material, providing an etch-stop layer over the first dielectric layer and around the conductive plug, providing a second layer of dielectric material over the conductive plug and etch-stop layer, etching the second layer of dielectric material to the conductive plug and etch-stop layer to form a via, and forming a conductive connector in the via in contact with the conductive plug.

These and other advantages and features of the invention will be more readily understood from the following detailed description which is provided in connection with the accompanying drawings.

DETAILED DESCRIPTION OF PREFERRED EMBODIMENTS

Figure 4:
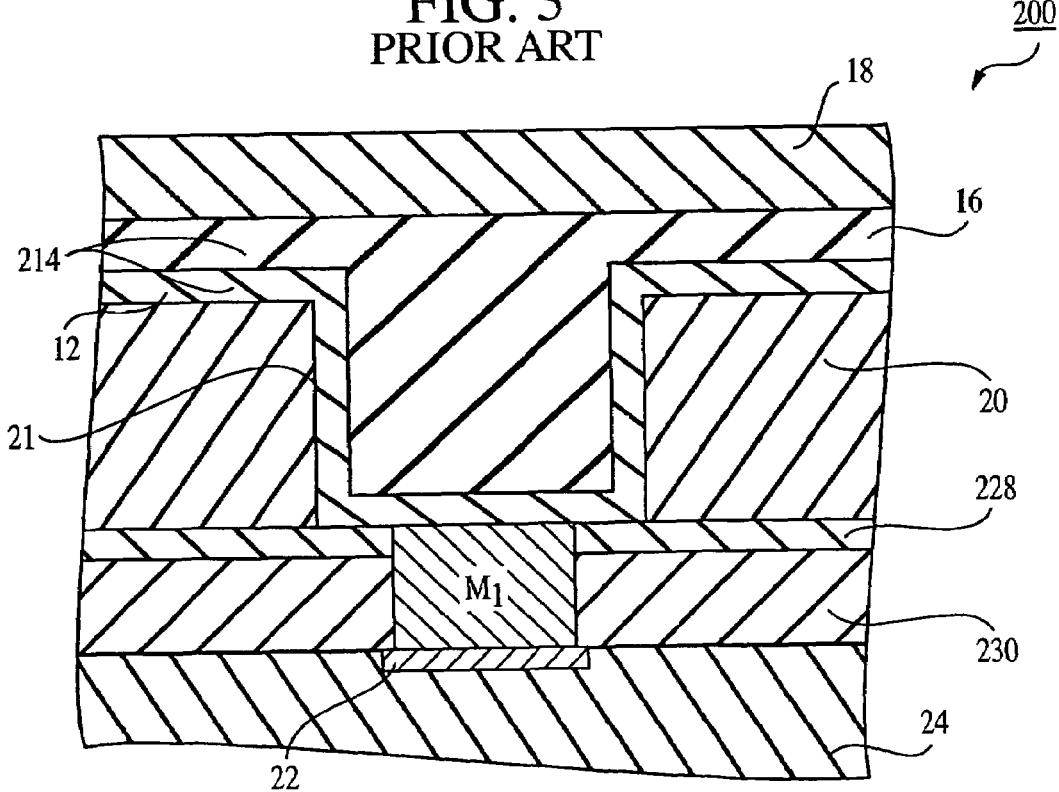
FIG. 4 is a cross-sectional view of a semiconductor device constructed in accordance with an embodiment of the present invention.

Referring now to the drawings, where like numerals designate like elements, there is shown in FIG. 4 a semiconductor device 200 with a substrate 24 and a conductive connection 214 that may be formed by either the single Damascene or double Damascene methods. The substrate 24 can be made of any material typically used as a substrate in integrated circuit fabrication. The conductive connection 214 includes the first and second conductive layers 12, 16. The conductive layers 12, 16 may be formed of one or more of aluminum, copper, doped polysilicate, tantalum, tantalum nitride, titanium, titanium nitride and tungsten. The semiconductor device 200 includes the material 20 surrounding the via 21. The metal plug $M_1$ is embedded within a first insulator layer 230, for example, a BPSG layer, and a hard mask layer 228. The hard mask layer 228 may be formed of any material capable of withstanding the subsequent etching process described below, such as, for example, silicon nitride, silicon carbide, silicon dioxide, or BLOK® (a mixture of silicon nitride and silicon carbide).

If the hard mask 228 is formed of, for example, silicon nitride, a plasma etch using $CF_4$ or $C_2F_6$ as the etching gas may be utilized to form the via 21. When either of these etching gases reacts with the BPSG material 20, the oxygen contained within the material 20 is released and will react with the carbon in the etching gas to form carbon dioxide and desorb. However, when the etching gas reacts with the silicon nitride, there is no oxygen in the film, so a polymer containing carbon is formed. The polymer slows down or stops the etch of the silicon nitride, particularly, when the carbon to flourine ratio is high.

Figure 1:
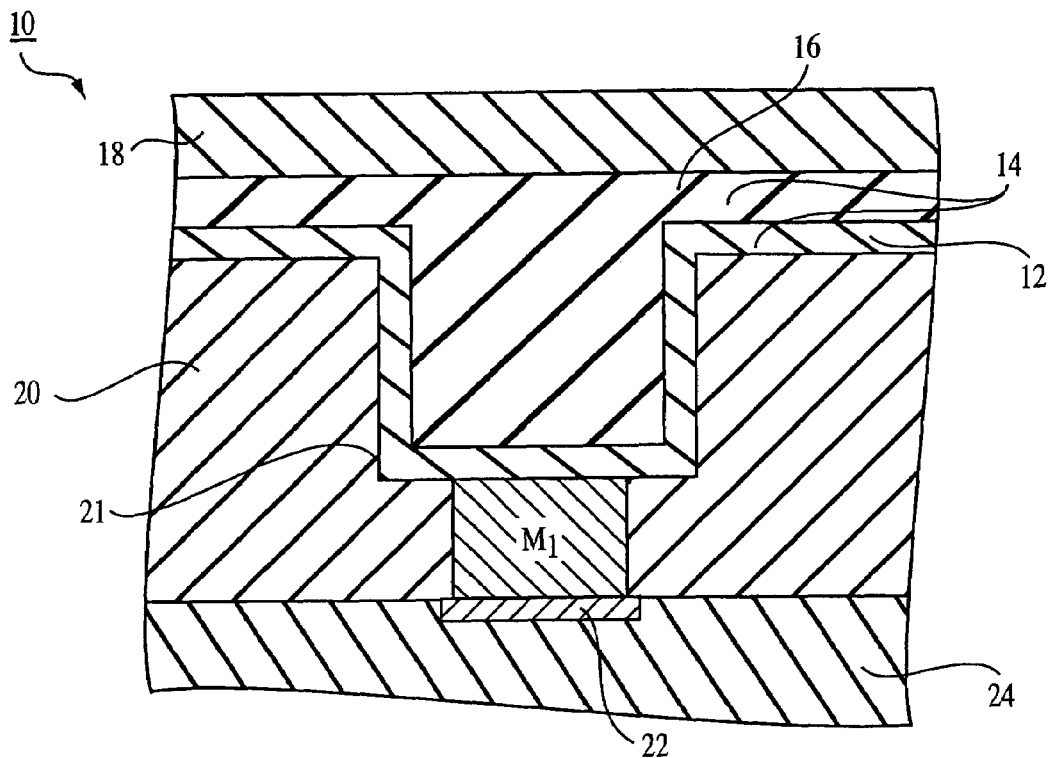
FIG. 1 is an idealized cross-sectional view of a conventionally fabricated conductor connection in a semiconductor device.
Figure 2:
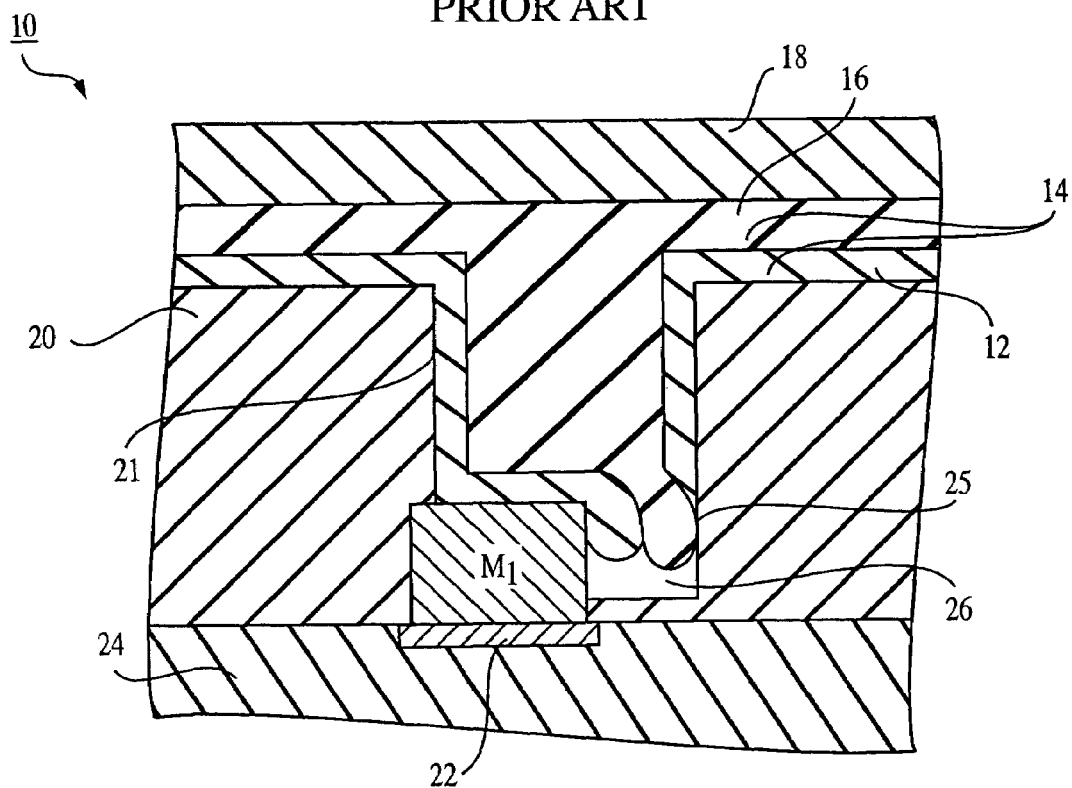
FIG. 2 is a cross-sectional view like FIG. 1 showing an offset via.
Figure 3:
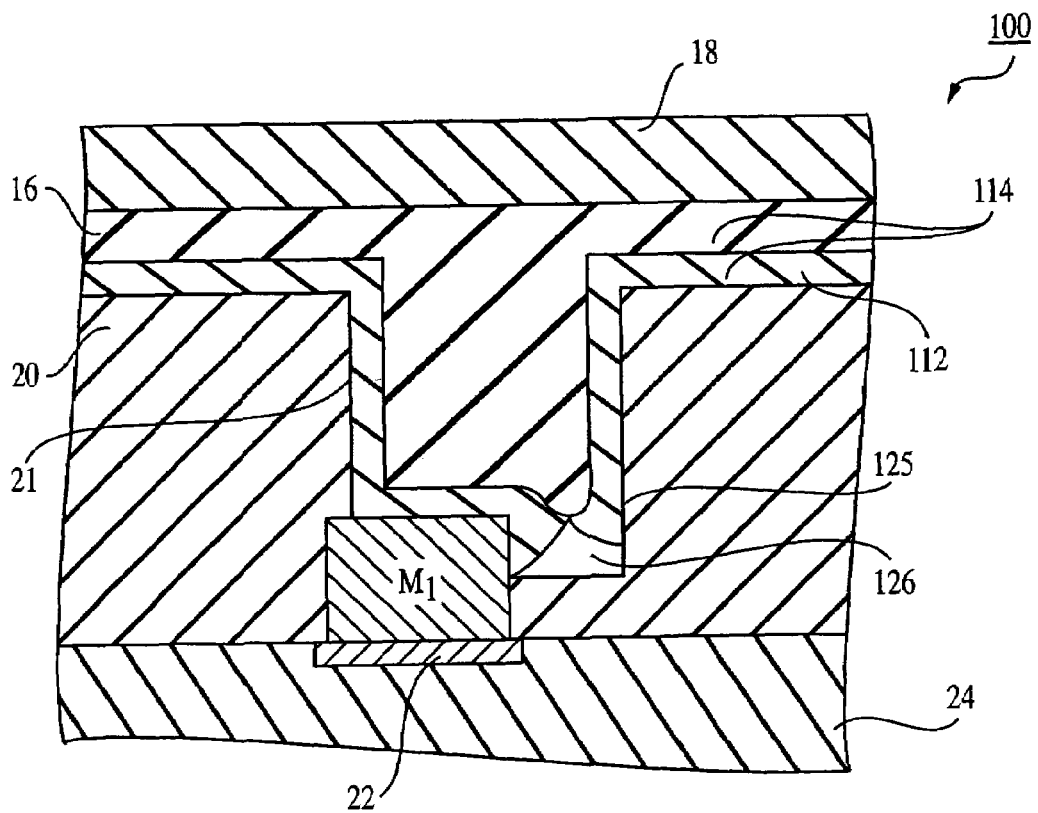
FIG. 3 is a cross-sectional view like FIG. 2 showing another offset via.

The result of this etching process is that etching of the insulating layer 20 to form the via 21 will stop at the hard mask 228 and the formation of an offset opening like the offset openings 25, 125 shown in FIGS. 2 and 3 will be prevented. Accordingly, as shown in FIG. 4, the via 21 etching stops at the top surface of the conductive plug $M_1$ and mask 228. The layers 12, 16 can then be fabricated in the via 21 and the conductive connection 214 can be used to connect the doped region 22 to other portions of the partially illustrated semiconductor device 200.

Next, a method of forming the conductive connection 214 (FIG. 4) will be described with reference to FIG. 7. At step 400, the insulator layer 230 and the hard mask 228 are deposited on the substrate 24 containing the doped region 22. The doped region 22 may be formed by way of an ion implant. Further, the doped region 22 may serve as an active region in a memory cell, such as cell 513 (described below). It should be noted that the doped region 22 is merely illustrative of just one point on a substrate where an electrical connection is needed. The conductive connection 214 can be fabricated wherever a conductive path is needed. An opening is formed in the insulator 230 and the hard mask 228 layers at step 405. The opening is preferably formed through the use of a photoresist and masking, followed by one or more anisotropic etching steps. The opening alternatively may be formed through mechanical or laser drilling. After stripping the photoresist, conductive material, e.g., polysilicon, is deposited over the insulator 230, including in the opening, and is chemical-mechanical polished (CMP) to form the conductive plug $M_1$ at step 410. The planarizing process causes the top surface of the etch-resistant layer 228 to be co-planar with the top surface of the conductive element $M_1$.

An insulating layer 20, e.g. BPSG, is then deposited on the insulator 230 (step 415) and the via 21 is subsequently etched into the insulating layer 20 (step 420). The etching of via 21 is preferably accomplished by laying a photoresist over the material 20, exposing and developing the phtotoresist to mask a portion of the material 20 that is not to be etched, and then etching the via 21 in the unmasked region. As noted, the hard mask 228 is formed of a material which is relatively resistant to the etching chemistry, and hence acts as an etch stop so there is little or no etching below the top level of the conductive plug $M_1$. The first conductive layer 12 is then deposited at step 425 and the second conductive layer 16 is deposited on the first conductive layer 12 at step 430, thereby creating the conductive connection 214.

Figure 5:
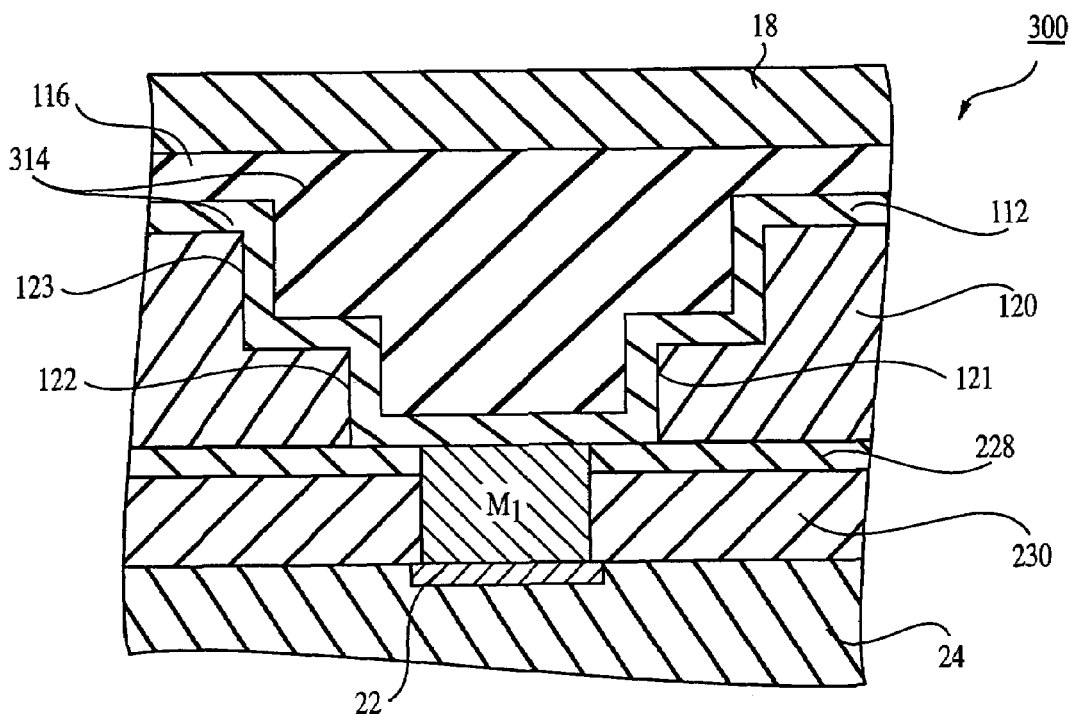
FIG. 5 is a cross-sectional view of a semiconductor device constructed in accordance with another embodiment of the present invention.

FIG. 5 shows a multi-step semiconductor device 300 having a conductive connection 314. The multi-step semiconductor device 300 has a greater conductive surface area which can be used to form container capacitors, useful, for example, in a memory device. A via 121 is etched above the metallic plug $M_1$ in several steps to create via portions 122 and 123. The via portion 123 has a greater diameter than the via portion 122, allowing the deposition of more area of first and second conductive layers 112 and 116. If capacitors are formed in the FIG. 5 via portions 122 and 123, then the conductive layer 112 is replaced by a three layer structure formed of a conductor layer, a dielectric layer, and another conductive layer, as is known in the art.

Figure 6:
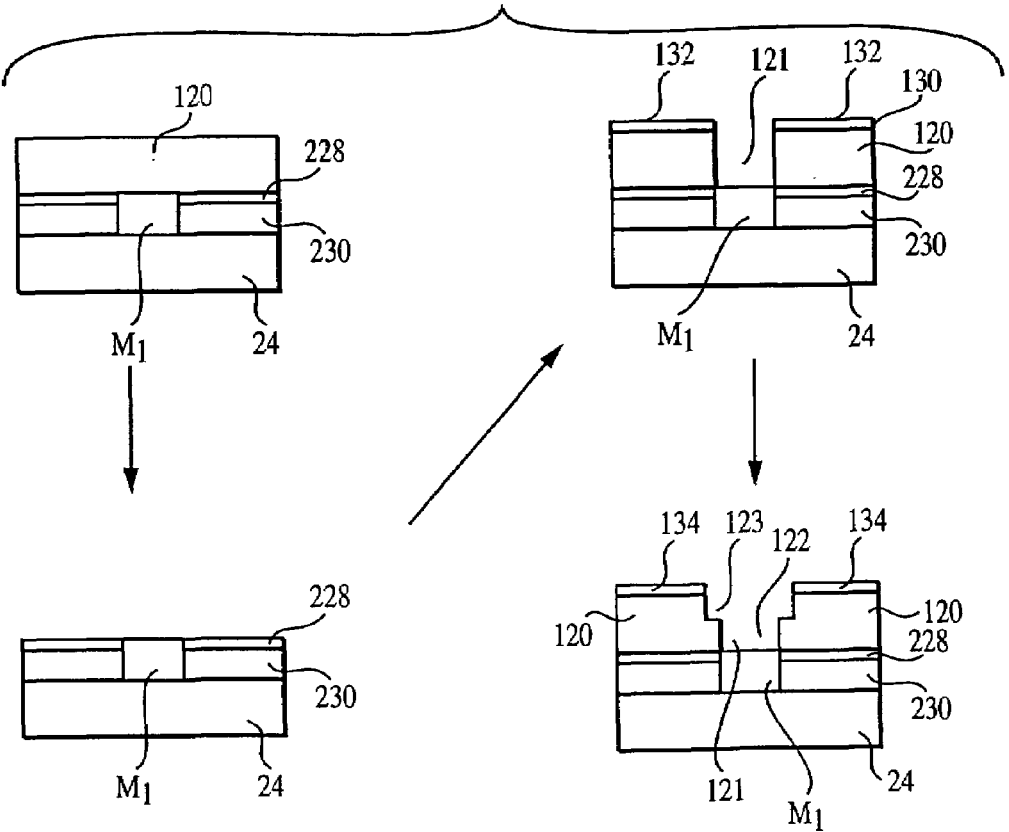
FIG. 6 illustrates a method of making the device shown in FIG. 5.
Figure 7:
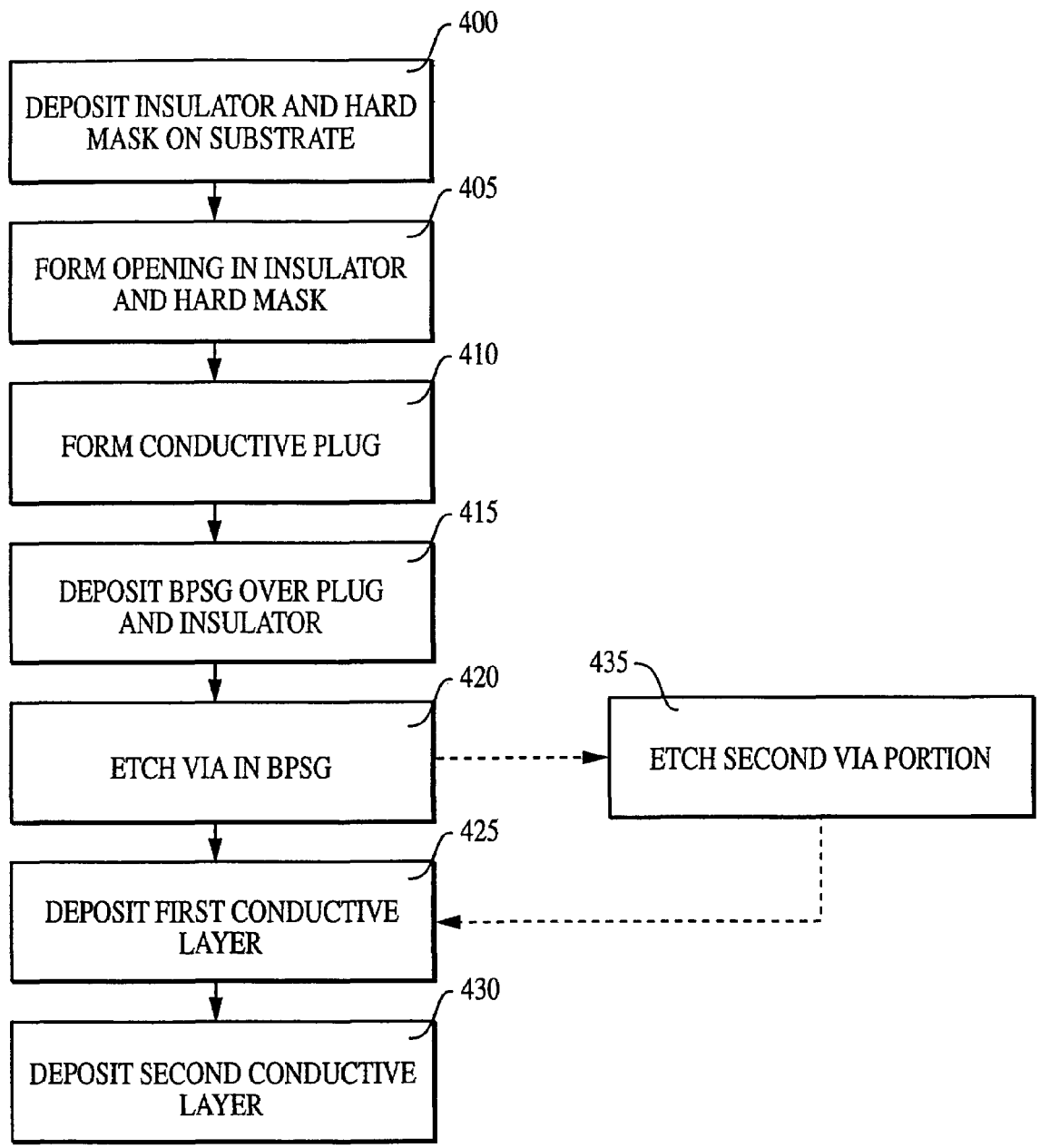
FIG. 7 illustrates a method of making semiconductor products in accordance with an embodiment of the present invention.

Referring now to FIGS. 6 and 7, to form the semiconductor device 300 (FIG. 5), the via 121 is etched in several steps to form the via portions 122 and 123. Specifically, a layer of the material 120 is deposited over the hard mask 228 and the plug $M_1$ (step 410). After laying down a photoresist 130 and a mask 132, photoresist 130 is partially developed, and the developed portions and the mask 132 are removed and the remaining photoresist 130 is stripped. The via portion 122 is then etched at step 415. A second layer of photoresist 130 is then deposited. A second mask 134 is utilized to develop a portion of the second photoresist layer 130. The developed portion is removed as described above. Further the mask 134 is removed and the remaining photoresist 130 is stripped. The via portion 123 is then etched at step 435. After the via portions 122, 123 have been formed, and the photoresist 130 and mask 134 have been removed, layers 112, 116 (which are similar to the layers 12, 16, respectively) are deposited in the via 121 (steps 425, 430).

Figure 8:
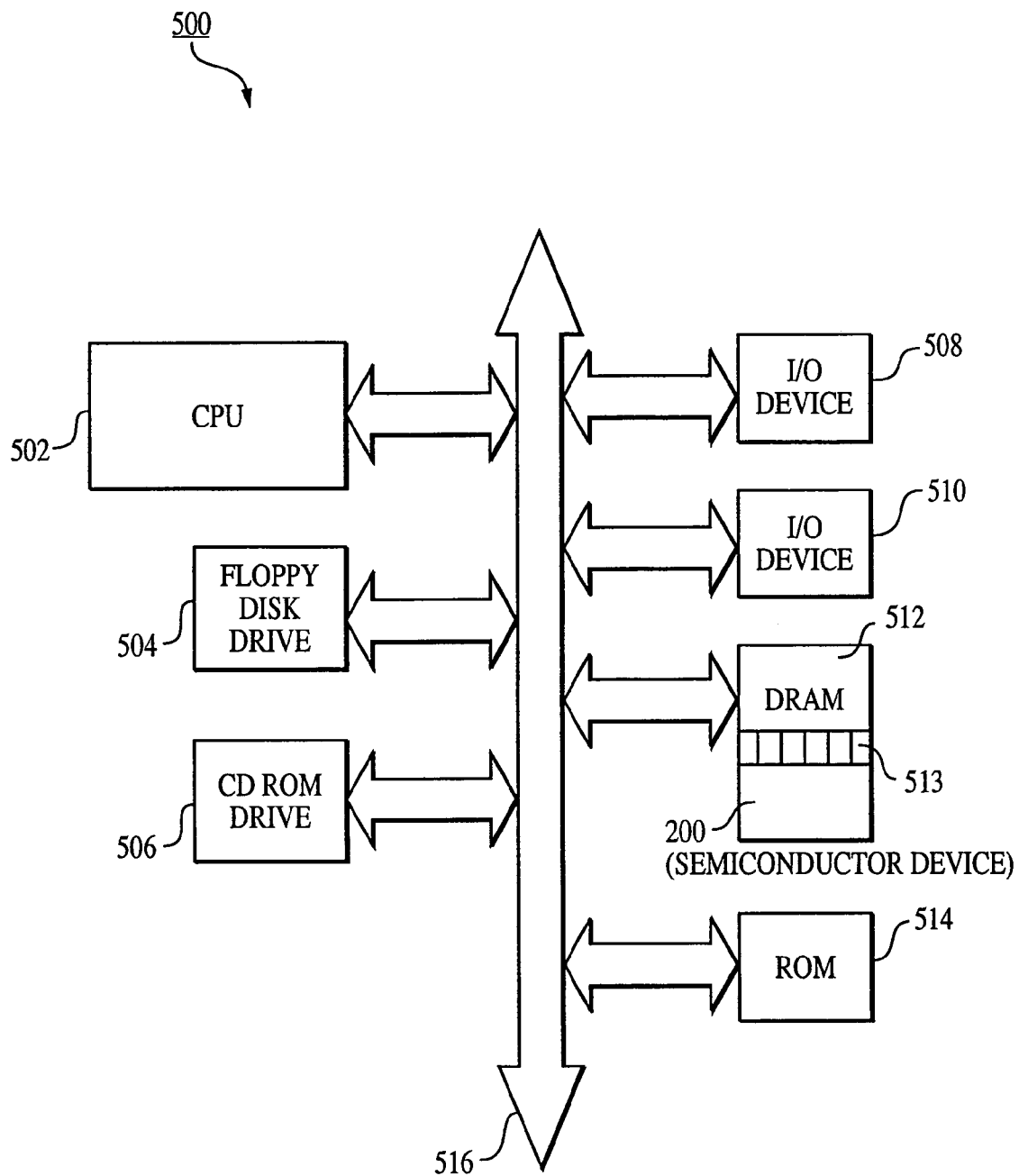
FIG. 8 illustrates a processor-based system constructed in accordance with an embodiment of the present invention.

Referring now to FIG. 8, a device constructed in accordance with the invention can be used in a memory circuit, such as a DRAM device 512, or other electronic integrated circuit, within a processor-based system 500. The processor-based system 500 may be a computer system, a process control system or any other system employing a processor and associated memory. The system 500 includes a central processing unit (CPU) 502, which may be a microprocessor. The CPU 502 communicates with the DRAM device 512, which has cells 513 that include the semiconductor device 200 (or the semiconductor device 300), over a bus 516. The CPU 502 further communicates with one or more I/O devices 508, 510 over the bus 516. Although illustrated as a single bus, the bus 516 may be a series of buses and bridges commonly used in a processor-based system. Further components of the system 500 may include a read only memory (ROM) device 514 and peripheral devices such as a floppy disk drive 504, and CD-ROM drive 506. The floppy disk drive 504 and CD-ROM drive 506 communicate with the CPU 502 over the bus 516.

The present invention provides a semiconductor device which does not suffer from the aforementioned disadvantages caused by an etched area to the side of the conductive plug $M_1$. The present invention further provides a method for making semiconductor devices without forming air gaps in trenches offset from a conductive plug.

While the invention has been described in detail in connection with preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of making a semiconductor device, said method comprising:
   forming a layer of insulating material over a substrate;
   forming a conductive plug within said first layer of insulating material, wherein said conductive plug consists essentially of a single conductive material;
   forming an etch-stop layer over said first layer of insulating material and around said conductive plug;
   forming a second layer of insulating material over said conductive plug and etch-stop layer; and
   etching said second layer of insulating material to said conductive plug and etch-stop layer to form a first and second via, wherein said first via is wider than the conductive plug's width, and said second via is wider than said first via.

2. The method of claim 1, further comprising depositing at least a first conductive layer in said first and second vias.

3. The method of claim 2, comprising depositing a second conductive layer over said first conductive layer in said first and second vias.

4. The method of claim 1, wherein said plug is formed by:
   forming an opening in said first layer of insulating material;
   depositing a conductive material on said first layer of insulating material, filling said opening; and
   abrading said conductive material from the top surface of said first layer of insulating such that only conductive material within said opening remains.

5. The method of claim 4, wherein said abrading comprises chemical-mechanical polishing of said conductive material.

6. The method of claim 4, wherein said conductive plug is connected to a doped region in said substrate.

7. A method of making a semiconductor device, said method comprising:
   forming a first non-conductive layer over a substrate;
   forming a conductive plug within said first non-conductive layer, wherein said conductive plug consists essentially of a single conductive material;
   forming an etch-stop layer over said first non-conductive layer and surrounding at least a portion of said conductive plug;
   forming a second non-conductive layer over said conductive plug and the etch-stop layer;
   forming a first and second via by etching said second non-conductive layer to said conductive plug and etch-stop layer, wherein said first etched via is wider in diameter than said conductive plug; and
   depositing a conductive material within said first and second etched vias.

8. A method of making a semiconductor device, said method comprising:
   forming an active region in a semiconductor substrate;
   forming a first insulator layer over said active region;
   forming a single conductive material within said first insulator layer, wherein said conductive material is electrically connected with said active region;
   forming an etch-stop layer over said first insulator layer and around said conductive material;
   forming a second insulator layer over said conductive material and the etch-stop layer;
   forming a first and second via within said second insulator layer, wherein said first via is wider in diameter than said conductive material, and wherein said second via is wider in diameter than said first via; and
   forming a conductive connector in said first and second vias that are in electrical contact with said conductive material.

* * * * *

UNITED STATES PATENT AND TRADEMARK OFFICE
CERTIFICATE OF CORRECTION

| | |
|---|---|
| PATENT NO. | : 7,056,823 B2 |
| APPLICATION NO. | : 11/032093 |
| DATED | : June 6, 2006 |
| INVENTOR(S) | : Chih-chen Cho |

It is certified that error appears in the above-identified patent and that said Letters Patent is hereby corrected as shown below:

Claim 4, column 6, line 21, "insulating such" should read --insulating material such--.

Signed and Sealed this

Third Day of October, 2006

JON W. DUDAS
*Director of the United States Patent and Trademark Office*